(12) United States Patent
Yu

(10) Patent No.: US 12,041,803 B2
(45) Date of Patent: Jul. 16, 2024

(54) LIGHT-EMITTING DIODE DEVICE AND MANUFACTURING METHOD THEREFOR, AND DISPLAY PANEL AND DISPLAY APPARATUS

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Gang Yu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 731 days.

(21) Appl. No.: 17/271,619

(22) PCT Filed: May 20, 2020

(86) PCT No.: PCT/CN2020/091173
§ 371 (c)(1),
(2) Date: Feb. 26, 2021

(87) PCT Pub. No.: WO2020/238713
PCT Pub. Date: Dec. 3, 2020

(65) Prior Publication Data
US 2021/0320272 A1    Oct. 14, 2021

(30) Foreign Application Priority Data
May 24, 2019 (CN) .......................... 201910441452.6

(51) Int. Cl.
*H10K 50/155* (2023.01)
*H10K 50/115* (2023.01)
(Continued)

(52) U.S. Cl.
CPC ......... *H10K 50/155* (2023.02); *H10K 50/156* (2023.02); *H10K 71/00* (2023.02);
(Continued)

(58) Field of Classification Search
CPC ........................ H10K 2101/80; H10K 50/156
See application file for complete search history.

(56) References Cited

U.S. PATENT DOCUMENTS

| 10,276,820 B2 | 4/2019 | Ju et al. |
| 2018/0233688 A1* | 8/2018 | Chen ...................... H10K 50/81 |

(Continued)

FOREIGN PATENT DOCUMENTS

| CN | 105870349 A | 8/2016 |
| CN | 106098956 A | 11/2016 |

(Continued)

OTHER PUBLICATIONS

First office action issued in Chinese Patent Application No. 201910441452.6 with search report.
(Continued)

*Primary Examiner* — Raj R Gupta
(74) *Attorney, Agent, or Firm* — Chiwin Law LLC

(57) ABSTRACT

A light emitting diode device and a manufacturing method thereof, a display panel, and a display apparatus are provided. The light emitting diode device includes a quantum dot light emitting layer and a hole transport layer on a side of the quantum dot light emitting layer. The hole transport layer includes a perovskite material and an organic hole transport material. The high carrier mobility of the perovskite material can improve the carrier transport performance of the hole transport layer.

18 Claims, 4 Drawing Sheets

(51) Int. Cl.
  *H10K 50/15* (2023.01)
  *H10K 50/16* (2023.01)
  *H10K 59/12* (2023.01)
  *H10K 71/00* (2023.01)
  *H10K 85/30* (2023.01)
  *H10K 102/00* (2023.01)

(52) U.S. Cl.
  CPC ........... *H10K 85/30* (2023.02); *H10K 50/115* (2023.02); *H10K 50/16* (2023.02); *H10K 59/12* (2023.02); *H10K 2102/00* (2023.02); *H10K 2102/331* (2023.02)

(56) References Cited

U.S. PATENT DOCUMENTS

2019/0173025 A1   6/2019   Uchida et al.
2021/0143356 A1   5/2021   Zhang

FOREIGN PATENT DOCUMENTS

| CN | 107104193 A | * | 8/2017 | ........... H01L 51/001 |
| CN | 107104193 A |  | 8/2017 |  |
| CN | 108219786 A |  | 6/2018 |  |
| CN | 108886101 A |  | 11/2018 |  |
| CN | 109473559 A |  | 3/2019 |  |
| CN | 109638165 A |  | 4/2019 |  |
| CN | 110112305 A |  | 8/2019 |  |
| WO | 2018064235 A1 |  | 4/2018 |  |
| WO | 2018123402 A1 |  | 7/2018 |  |

OTHER PUBLICATIONS

Second office action issued in Chinese Patent Application No. 201910441452.6 with search report.

* cited by examiner

LIGHT-EMITTING DIODE DEVICE AND MANUFACTURING METHOD THEREFOR, AND DISPLAY PANEL AND DISPLAY APPARATUS

CROSS-REFERENCE TO RELATED APPLICATION

This application is a U.S. National Phase Entry of International Application No. PCT/CN2020/091173 filed on May 20, 2020, designating the United States of America and claiming priority to Chinese Patent Application No. 201910441452.6, filed on May 24, 2019. The present application claims priority to and the benefit of the above-identified applications and the above-identified applications are incorporated by reference herein in their entirety.

TECHNICAL FIELD

The present disclosure relates to a light emitting diode device and a manufacturing method thereof, a display panel, and a display apparatus.

BACKGROUND

Quantum dots are solution processable semiconductor nanocrystals, have the advantages of narrow emission spectrum, adjustable emission wavelength, and high spectral purity, etc., and are most promising to become the core part of the next generation of light emitting devices. Quantum dot light emitting diodes (short for QLED) use the quantum dots as the materials for manufacturing the light emitting layers, and the light emitting layer is introduced between different conductive materials can obtain light, the wavelength of which is needed. The QLED has the advantages of high color gamut, self-illumination, low starting voltage, fast response speed, long life, etc.

SUMMARY

According to at least one embodiment of the present disclosure, a light emitting diode device is provided. The light emitting diode device comprises: a light emitting layer; and a hole transport layer on a side of the light emitting layer, the hole transport layer comprises a perovskite material and an organic hole transport material.

In some embodiments, a molar ratio of the organic hole transport material in the hole transport layer is greater than 0% and less than or equal to 10%.

In some embodiments, the molar ratio of the organic hole transport material in the hole transport layer increases in a gradient in a direction away from the light emitting layer.

In some embodiments, the hole transport layer is formed by co-evaporating a perovskite precursor and the organic hole transport material.

In some embodiments, the hole transport layer has a stacked structure formed by the perovskite material and the organic hole transport material.

In some embodiments, a general molecular formula of the perovskite material is $ABX_3$; the A comprises a monovalent alkali metal, a small molecule organic ammonium, or Tl; the B comprises Pb or Sn; and the X comprises Cl or Br.

In some embodiments, the perovskite material comprises $MAPbCl_3$.

In some embodiments, the organic hole transport material comprises at least one selected from a group consisting of CBP, TCTA, TFB, TPD, NPB, and TAPC.

In some embodiments, the light emitting diode device comprises a first electrode, an electron transport layer, the light emitting layer, the hole transport layer, a hole injection layer, and a second electrode, which are sequentially stacked.

In some embodiments, the electron transport layer is a ZnO nanoparticle layer or a $TiO_2$ nanorod layer.

In some embodiments, the light emitting layer is a quantum dot light emitting layer or an organic light emitting layer.

According to at least another embodiment of the present disclosure, a display panel is provided. The display panel comprises: a base substrate; and a plurality of light emitting diode devices mentioned above arranged in an array on a surface of the base substrate.

According to at least another embodiment of the present disclosure, a display apparatus is provided. The display apparatus comprises a display panel as described above.

According to at least another embodiment of the present disclosure, a manufacturing method of a light emitting diode device is provided. The method comprises: forming a light emitting layer; and forming a hole transport layer on a side of the light emitting layer; the hole transport layer comprises a perovskite material and an organic hole transport material.

In some embodiments, a molar ratio of the organic hole transport material in the hole transport layer is greater than 0% and less than or equal to 10%.

In some embodiments, the molar ratio of the organic hole transport material in the hole transport layer increases in a gradient in a direction away from the light emitting layer.

In some embodiments, forming the hole transport layer on the side of the light emitting layer comprises: co-evaporating a perovskite precursor and the organic hole transport material to form the hole transport layer on the side of the light emitting layer; and baking the hole transport layer.

In some embodiments, the hole transport layer has a stacked structure formed by the perovskite material and the organic hole transport material.

In some embodiments, the perovskite precursor comprises MACl and $PbCl_2$; and the perovskite material comprises $MAPbCl_3$.

In some embodiments, a general molecular formula of the perovskite material is $ABX_3$; the A comprises a monovalent alkali metal, a small molecule organic ammonium, or Tl; the B comprises Pb or Sn; and the X comprises Cl or Br.

In some embodiments, the organic hole transport material comprises at least one selected from a group consisting of CBP, TCTA, TFB, TPD, NPB, and TAPC.

In some embodiments, the light emitting layer is a quantum dot light emitting layer or an organic light emitting layer.

BRIEF DESCRIPTION OF THE DRAWINGS

In order to explain the technical solutions of the embodiments of the present disclosure more clearly, the drawings of the embodiments will be briefly introduced below. It is obvious that the described drawings are only related to some embodiments of the present disclosure and thus are not limitative to the present disclosure.

DETAILED DESCRIPTION

Figure 1:
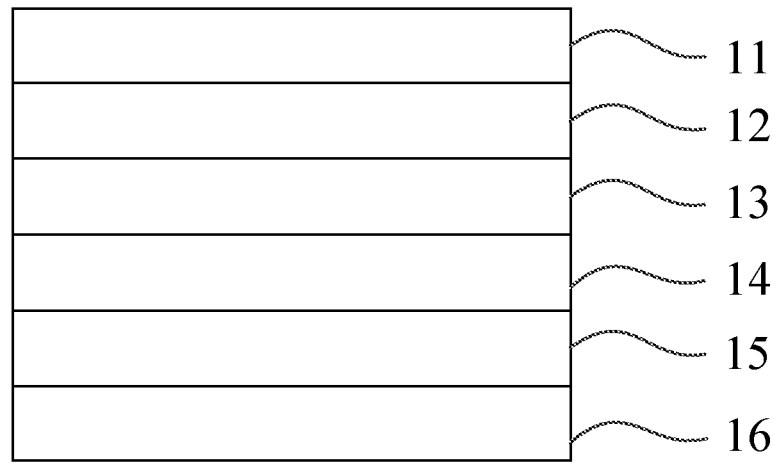
FIG. 1 is a schematic diagram of a structure of a QLED device.

In order to make objects, technical solutions, and advantages of the embodiments of the present disclosure more apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure. The shape and size of each part in the drawings do not reflect the real scale of each part, but merely schematically illustrate the contents of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount, or importance, but distinguish various components. Similarly, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

As shown in FIG. 1, a QLED device 10 comprises a first electrode 11, an electron transport layer 12, a quantum dot light emitting layer 13, a hole transport layer 14, a hole injection layer 15, and a second electrode 16, which are sequentially stacked. Under the action of an electric field, holes and electrons move to achieve migration of carriers in the hole transport layer 14 and the electron transport layer 12 respectively and recombine into excitons in the quantum dot light emitting layer 13 to emit light.

The QLED device uses inorganic ZnO nanoparticles as the electron transport material. The carrier transport performance of the inorganic ZnO nanoparticles is high, and the electron mobility is generally $10^{-3}$ $cm^2$ $V^{-1}$ $s^{-1}$ order of magnitude. On the other hand, the hole transport material used in the QLED device is organic substance. The carrier transport performance of the organic substance is low, and the hole mobility is generally $10^{-5}$-$10^{-4}$ $cm^2$ $V^{-1}$ $s^{-1}$ order of magnitude, which does not match with the carrier transport performance of the electron transport material. This easily leads to an imbalance of carrier transporting in the QLED device, and the exciton recombination region is at the interface between the hole transport layer 14 and the quantum dot light emitting layer 13 or even into the hole transport layer 14.

At least one embodiment of the present disclosure provides a light emitting diode device. The light emitting diode comprises a light emitting layer and a hole transport layer on a side of the light emitting layer. The hole transport layer 14 comprises a perovskite material and an organic hole transport material. For example, the light emitting diode device further comprises an electron transport layer on the other side of the light emitting layer, and further comprises a first electrode (cathode) located on the side of the electron transport layer away from the light emitting layer and a second electrode (anode) located on the side of the hole transport layer away from the light emitting layer. For example, the light emitting diode device is a QLED device or an organic light emitting diode (OLED) device. Hereinafter, the present disclosure takes the QLED device as an example for description, but the present disclosure is not limited to this.

Figure 2:
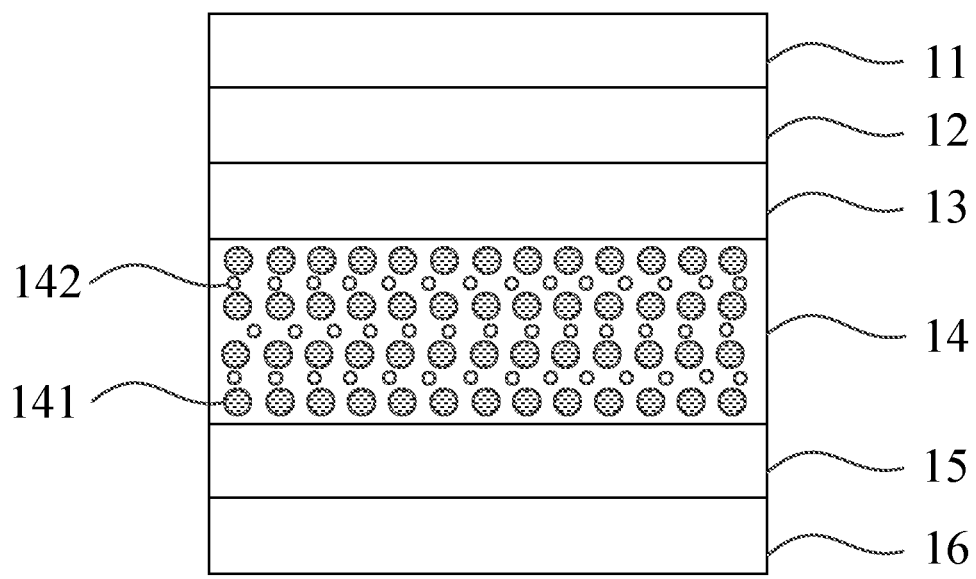
FIG. 2 is a schematic diagram of a structure of a QLED device according to an embodiment of the present disclosure.

As shown in FIG. 2, the QLED device comprises a quantum dot light emitting layer 13 and a hole transport layer 14 on a side of the quantum dot light emitting layer. The hole transport layer 14 comprises a perovskite material 141 and an organic hole transport material 142.

For example, the hole transport layer 14 comprises a mixed hole transport layer material obtained by mixing the perovskite material 141 and the organic hole transport material 142.

The perovskite material 141 has high carrier mobility, which is, for example, more than $10^{-1}$ $cm^2$ $V^{-1}$ $s^{-1}$. The carrier transport performance of the hole transport layer 14 can be improved by using the perovskite material 141 as the main body material of the hole transport layer 14, so that the carrier transport performance of the hole transport layer 14 is matched with the carrier transport performance of the electron transport layer 12, thereby eliminating the problem of the carrier transporting imbalance caused by the pure organic hole transport layer. On the other hand, the carrier diffusion distance of the perovskite material 141 is large, which easily causes excessive holes to accumulate at the interface between the hole transport layer 14 and the quantum dot light emitting layer 13, thereby reducing efficiency and durability of the device. The hole transport layer 14 is doped with the organic hole transport material 142 to adjust the carrier transport performance of the hole transport layer 14. The organic hole transport material 142 can self-assemble in the perovskite material 141 to form a directional hole channel, which makes the transport of the holes more controllable, thereby avoiding the accumulation of excessive holes at the interface between the hole transport layer 14 and the quantum dot light emitting layer 13. Therefore, using the perovskite material 141 and the organic hole transport material 142 as the hole transport layer of the QLED device improves the carrier transport performance of the QLED device 10, and ensures the efficiency and durability of the QLED device 10 at the same time.

Although the organic hole transport material 142 can play a role in adjusting the carrier transport performance of the hole transport layer 14, an excessively high proportion of organic substance may destroy the crystal form of the perovskite. Therefore, in some embodiments of the present disclosure, the molar ratio of the organic hole transport material 142 in the hole transport layer 14 is greater than 0% and less than or equal to 10%, such as 1%~8%.

For example, the thickness range of the hole transport layer can be from 30 nm to 3000 nm, for example, 50 nm-1500 nm, for example, 150 nm-500 nm. The thickness range can be determined according to the carrier mobility and the thickness of the selected material of the electron transport layer, so that in the obtained QLED device, the excitons obtained by the recombination of electrons and holes are located in the light emitting layer.

Figure 3:
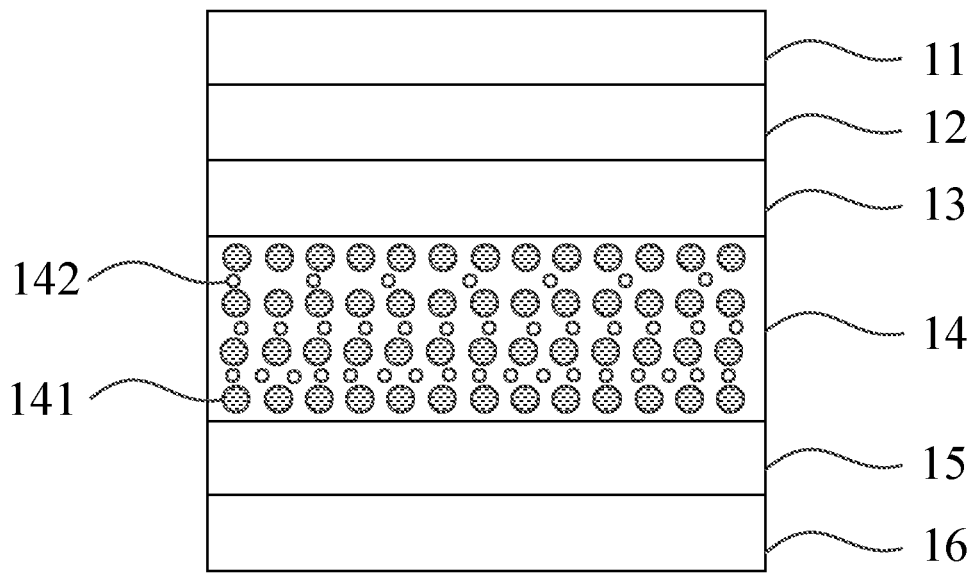
FIG. 3 is a schematic diagram of a structure of a QLED device according to another embodiment of the present disclosure.

In some embodiments, as shown in FIG. 3, the molar ratio of the organic hole transport material 142 in the hole transport layer 14 can increase in a gradient in a direction away from the light emitting layer 13, that is, the hole transport layer 14 on the side close to the quantum dot light emitting layer 13 has a lower organic substance doping ratio (for example, the molar ratio is 1%), and the hole transport layer 14 on the side away from the quantum dot light emitting layer 13 has a higher organic substance doping ratio (for example, the molar ratio is 10%). In some embodiments, the band gap of the organic hole transport material is narrower than the band gap of the perovskite material, and the function of exciton confinement can be achieved by such a gradient doping method.

The above hole transport layer can be prepared by a ternary organic-inorganic hybrid co-evaporation process. The doping ratio of the organic hole transport material in the perovskite can be adjusted precisely by effectively controlling the evaporation condition of the perovskite precursor and the organic substance, and the problem that the perovskite is easily damaged by the subsequent solution preparation layer in the solution method can be avoided by adopting the evaporation method.

Figure 4:
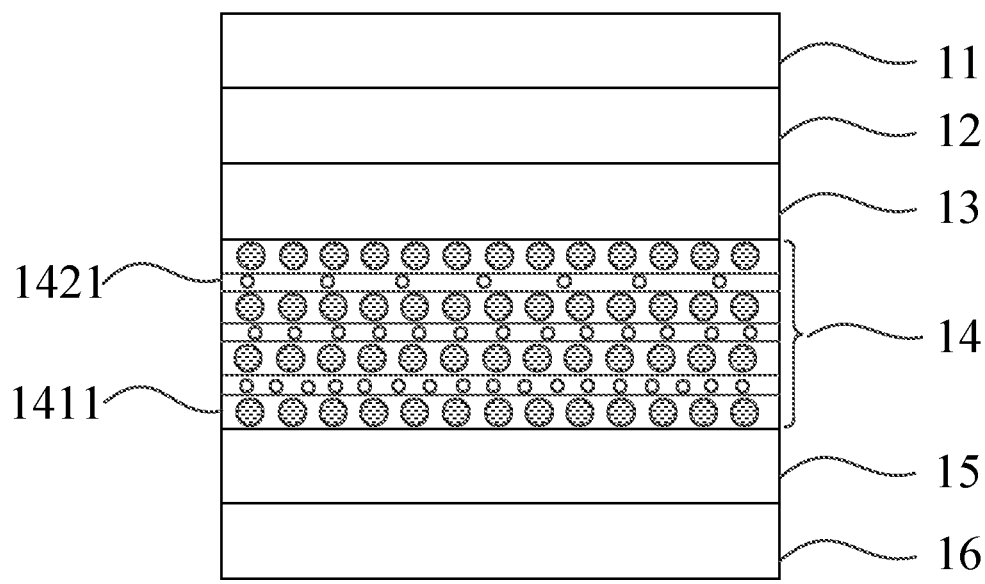
FIG. 4 is a schematic diagram of a structure of a QLED device according to still another embodiment of the present disclosure.

In some examples, as shown in FIG. 4, the hole transport layer prepared by the co-evaporation process can have a stacked structure formed by a perovskite material layer 1411 and an organic hole transport material layer 1421. The perovskite material layer 1411 has high carrier mobility, which can improve the carrier transport performance of the hole transport layer 14, and the organic hole transport material layer 1421 forms a directional hole channel to make the transport of the holes more controllable, thereby avoiding the accumulation of excessive holes at the interface between the hole transport layer 14 and the quantum dot light emitting layer 13. Therefore, the obtained hole transport layer improves the carrier transport performance of the QLED device and ensures the efficiency and durability of the QLED device at the same time.

For example, the general molecular formula of the perovskite material is $ABX_3$. In the embodiments of the present disclosure, the A can comprise a monovalent alkali metal, a small molecule organic ammonium (for example, methyl ammonium), or Tl, and the B can comprise Pb or Sn, and the X can comprise Cl or Br. For example, in an embodiment, the perovskite material can be a metal halide perovskite material, such as $MAPbCl_3$ (methylamine lead chloride).

For example, the organic hole transport material can be any electron-rich aromatic hole material known to those skilled in the art. For example, in an embodiment, the organic hole transport material can comprise at least one selected from a group consisting of 4,4'-bis (9-carbazole) biphenyl (CBP), tris (4-carbazol-9-ylphenyl) amine (TCTA), poly (9,9-dioctylfluorene-CO-N-(4-butylphenyl) diphenylamine) (TFB), N,N'-bis (3-methylphenyl)-N,N'-diphenyl-1,1'-biphenyl-4,4'-diamine (TPD), N,N'-diphenyl-N,N'-(1-naphthyl)-1,1'-biphenyl-4,4'-diamine (NPB), 4,4'-cyclohexyl bis[N,N-bis(4-methylphenyl)aniline] (TAPC).

As shown in FIG. 2-FIG. 4, the QLED device 10 can comprise a base substrate and comprise a first electrode 11, an electron transport layer 12, a quantum dot light emitting layer 13, a hole transport layer 14, a hole injection layer 15, and a second electrode 16, which are sequentially stacked on the base substrate.

In some embodiments, the material of the electron transport layer can be ZnO nanoparticle layer or $TiO_2$ nanorod layer. Of course, the electron transport layer can also be made of other suitable electron transport materials, which is not limited in the present disclosure.

In some embodiments, the base substrate can be a rigid substrate or a flexible substrate, the rigid substrate can be a glass substrate, a ceramic substrate, a plastic substrate, etc., the flexible substrate can be a plastic substrate (such as a polyimide substrate), a glass substrate, etc., and the present disclosure does not limit this.

In some embodiments, the material of an electron injection layer can comprise: an alkali metal halide, an alkaline earth metal halide, an alkali metal oxide, a metal carbonic acid compound, a metal complex material, an oxadiazole material, an imidazole material, or an o-phenanthroline derivative, and so on, and the present disclosure does not limit this.

In some embodiments, the material of the hole injection layer 15 can comprise: a star-shaped triphenylamine compound, a metal complex, a polyaniline, a fluor hydrocarbon, a porphyrin derivative, a P-type doping (P-Doped) amine derivative, a poly (3,4-ethylenedioxythiophene)-polystyrene sulfonic acid (PEDOT/PSS), a polythiophene, or a polyaniline, and the present disclosure does not limit this.

In some embodiments, the first electrode 11 is a cathode, and the material of the first electrode 11 can be a material with a low work function, for example, magnesium (Mg), calcium (Ca), indium (In), lithium (Li), aluminum (Al), silver (Ag), or alloys or fluorides thereof, such as magnesium (Mg)-silver (Ag) alloys, lithium (Li)-fluorine compounds, lithium (Li)-oxygen (O) compounds, etc., and the present disclosure does not limit this.

In some embodiments, the second electrode 16 is an anode, and the material of the second electrode 16 can be a metal, an alloy, or a combination of a metal, an alloy, and a metal oxide with a good conductive function, such as Ag, Au, Pd, Pt, Ag:Au (that is the alloy of Ag and Au), Ag:Pd, Ag:Pt, Al:Au, Al:Pd, Al:Pt, Ag:Au, Ag/Pd (that is a stacked layer of Ag and Pd), Ag/Pt, Ag/ITO, Ag/IZO, Al/Au, Al/Pd, Al/Pt, Al/ITO, Al/IZO, Ag:Pd/ITO, Ag:Pt/ITO, Al:Au/ITO, Al:Pd/ITO, Al:Pt/ITO, Ag:Au/ITO, Ag:Pd/IZO, Ag:Pt/IZO, Al:Au/IZO, Al:Pd/IZO, Al:Pt/IZO, Ag:Au/IZO, and the present disclosure does not limit this.

In some embodiments, the quantum dot light emitting layer 13 comprises silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, and so on, and the shape of the quantum dot can be spherical or quasi-spherical, and the particle size is between 2 nm-20 nm, which is not limited in the present disclosure. For example, in the embodiments of the present disclosure, the carrier mobility of the quantum dot light emitting layer is not higher than the carrier mobility of the hole transport layer, which is more convenient for capturing and trapping carriers.

In some embodiments of the present disclosure related to the OLED device, except that the materials of the light emitting layers are different, other parts can be substantially the same. The material of the organic light emitting layer of the OLED device can be a fluorescent-type light emitting material or a phosphorescent-type light emitting material, for example, can be a light emitting material obtained by doping. For example, the main body light emitting material comprises a metal complex material, an anthracene derivative, an aromatic diamine compound, a triphenylamine compound, an aromatic triamine compound, a benzidine diamine derivative, a triarylamine polymer, or a derivative containing carbazole group. The doped fluorescent light emitting material comprises coumarin dyes (coumarin 6, C-545T), quinacridone (DMQA), 2,5,8,11-tetra-tert-butylperylene, 5,6,11,12-tetraphenylnaphthacene, N,N'-Dimethyl quinacridone, or 4-(dinitrile methylene)-2-methyl-6-(4-dimethylamino-styrene)-4H-pyran (DCM) series, and the present disclosure does not limit this.

Figure 5:
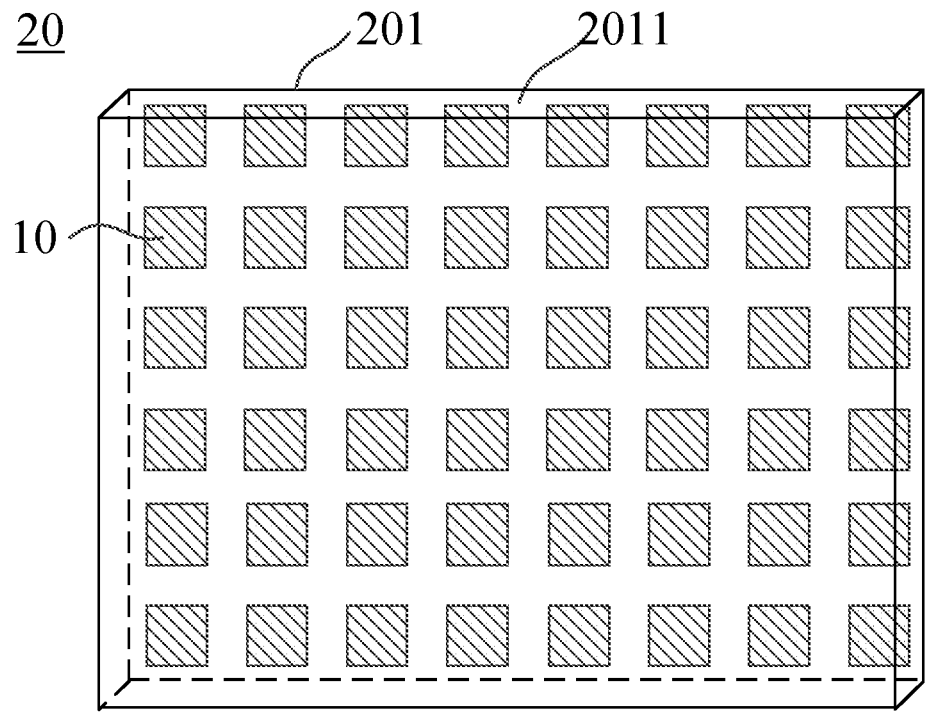
FIG. 5 is a schematic diagram of a QLED display panel and a display apparatus according to embodiments of the present disclosure.

According to another aspect of the present disclosure, as shown in FIG. 5, an embodiment of the present disclosure also provides a display panel 201. The display panel 201 comprises an array substrate 2011 and QLED devices 10 as the above embodiments arranged on the surface of the array substrate 2011 in an array. For example, the display panel 201 comprises a pixel array, and the pixel array comprises a plurality of sub-pixels arranged in an array. Each sub-pixel comprises a QLED device 10 and a pixel circuit for driving the QLED device 10, and the QLED device 10 is electrically connected to the corresponding pixel circuit. In this case, the array substrate serves as the base substrate of the QLED device.

For example, the pixel circuit of the sub-pixel is a 2T1C pixel circuit that comprises two TFTs (Thin-film transistors) and a storage capacitor Cs to drive the QLED device to emit light. One of the two TFTs is a driving transistor and the other is a data writing transistor. For another example, based on the above 2T1C pixel circuit, the pixel circuit can also have a compensation function that can be achieved by voltage compensation, current compensation, or hybrid compensation. The pixel circuit with the compensation function can be 4T1C or 4T2C, etc. for example, which will not be described in detail here.

The display panel 201 can further comprise a gate driving circuit and a data driving circuit. The pixel array further comprises a plurality of gate lines and a plurality of data lines interleaved with the plurality of gate lines. The plurality of gate lines are electrically connected to the gate driving circuit, for example, the plurality of gate lines are correspondingly connected to a plurality of rows of sub-pixels of the pixel array, so that the gate driving circuit provides scanning signals to the plurality of gate lines to control the plurality rows of the sub-pixels to be turned on sequentially. The plurality of data lines are electrically connected to the data driving circuit, for example, the plurality of data lines are correspondingly connected to a plurality of columns of sub-pixels of the pixel array, so that the data driving circuit applies data signals to the plurality of data lines, and thus in a case where the plurality of rows of the sub-pixels are turned on respectively, the data signals are written to the corresponding row of the sub-pixels, thereby achieving the display of one frame of image.

The display panel has all the features and advantages of the aforementioned QLED device, and will not be described in detail here.

According to another aspect of the present disclosure, as shown in FIG. 5, an embodiment of the present disclosure also provides a display apparatus 20. The display apparatus comprises the display panel 201 as mentioned above. As those skilled in the art will understand, the display apparatus 20 can further comprise necessary encapsulation elements and control circuits, which are not limited herein. The display apparatus can be implemented as any product or component with a display function, such as a mobile phone, a tablet computer, a television, a monitor, a notebook computer, a digital photo frame, a navigator, etc.

The display apparatus has all the features and advantages of the aforementioned QLED device, and will not be described in detail here.

According to another aspect of the present disclosure, the embodiments of the present disclosure also provide a manufacturing method of a light emitting diode device. The method can comprise: forming a light emitting layer; and forming a hole transport layer on a side of the light emitting layer. The hole transport layer comprises a perovskite material and an organic hole transport material. In the following, the manufacturing method of the above-mentioned QLED device is still taken as an example for non-limiting description.

Figure 6:
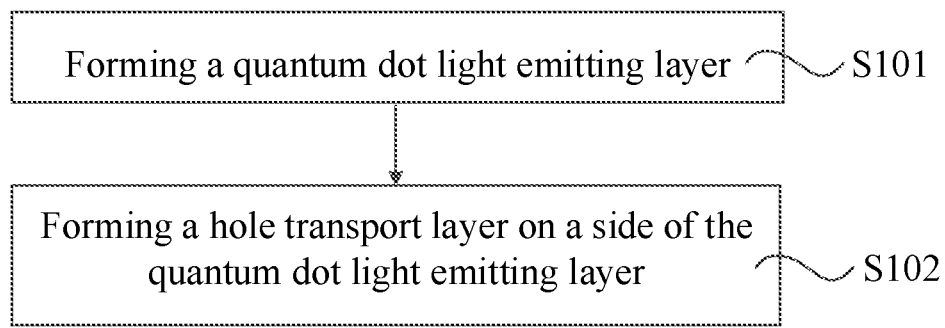
FIG. 6 is a flow diagram of a manufacturing method of a QLED device according to an embodiment of the present disclosure.

As shown in FIG. 6, the manufacturing method of the QLED according to at least one embodiment of the present disclosure can comprise the following steps:

step S101: forming a quantum dot light emitting layer; and step S102: forming a hole transport layer on a side of the quantum dot light emitting layer. The hole transport layer comprises a perovskite material and an organic hole transport material. The QLED device manufactured by this method may have the structure shown in FIG. 2.

The perovskite material 141 has high carrier mobility. Using the perovskite material 141 as the main body material of the hole transport layer 14 can improve the carrier transport performance of the hole transport layer 14, so as to match the carrier transport performance of the electron transport layer 12, thereby eliminating the problem of the carrier transporting imbalance caused by the pure organic hole transport layer. On the other hand, the carrier diffusion distance of the perovskite material 141 is large, which easily causes the accumulation of excessive holes at the interface between the hole transport layer 14 and the quantum dot light emitting layer 13, thereby reducing efficiency and durability of the device. The doped organic hole transport material 142 plays a role in adjusting the carrier transport performance of the hole transport layer 14. The organic hole transport material 142 can self-assemble in the perovskite material 141 to form a directional hole channel, which makes the transport of holes more controllable, thereby avoiding the accumulation of excessive holes at the interface between the hole transport layer 14 and the quantum dot light emitting layer 13. Therefore, the QLED device prepared by this method can improve the carrier transport performance of the QLED device and can ensure the efficiency and durability of the QLED device 10 at the same time.

Although the organic hole transport material 142 can play a role in adjusting the carrier transport performance of the hole transport layer 14, doping excessive organic hole transport material during the manufacturing process may destroy the crystal form of the perovskite. Therefore, in some embodiments of the present disclosure, the molar ratio of the organic hole transport material in the hole transport layer 14 is greater than 0% and less than or equal to 10%, such as 1%~8%.

In some manufacturing processes, the manufacturing condition of the hole transport layer 14 can be controlled, so that the molar ratio of the organic hole transport material 142 in the hole transport layer 14 increases in a gradient in a direction away from the quantum dot light emitting layer 13, that is, the hole transport layer 14 on the side close to the quantum dot light emitting layer 13 has a lower organic substance doping ratio (for example, the molar ratio is 1%), and the hole transport layer 14 on the side away from the quantum dot light emitting layer 13 has a higher organic substance doping ratio (for example, the molar ratio is 10%), thereby forming the gradient doping structure an shown in FIG. 3. In some embodiments, the band gap of the organic hole transport material is narrower than the band gap of the perovskite material, and the function of exciton confinement can be achieved by such a gradient doping method.

Figure 7:
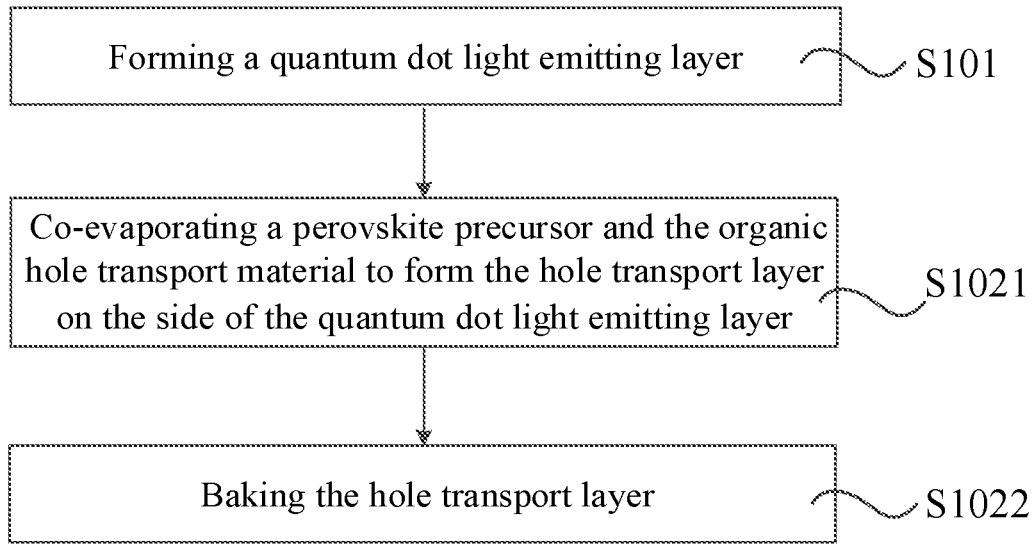
FIG. 7 is a flow diagram of a manufacturing method of a QLED device according to another embodiment of the present disclosure.

In some embodiments, the hole transport layer can be prepared by a ternary organic-inorganic hybrid co-evaporation process. In at least one embodiment, as shown in FIG. 7, the step of forming the hole transport layer on the side of the quantum dot light emitting layer comprises the following sub steps:

step S1021: co-evaporating a perovskite precursor and the organic hole transport material to form the hole transport layer on the side of the quantum dot light emitting layer;

step S1022: baking the hole transport layer.

For the specific process parameters of the co-evaporation and the baking, those skilled in the art can select appropriate parameters for different materials. For example, the vacuum degree of the working chamber can be $10^{-4}$~$10^{-5}$ Pa, and the evaporation rate of MACl/PbCl$_2$ can be 0.1~10 nm/s, and the evaporation rate of the organic small molecule hole transport material can be 0.01~1 nm/s, which is not limited in the present disclosure. The doping ratio of the organic substance can be adjusted precisely by effectively controlling the evaporation condition of the perovskite precursor and the organic substance, and the problem that the perovskite is easily damaged by the subsequent solution preparation layer in the solution method can be avoided by adopting the evaporation method.

In at least one example, in the process of the baking, the hole transport layer can form a stacked structure comprising a perovskite material layer 1411 and an organic hole transport material layer 1421 by self-assembling, as shown in FIG. 4, the perovskite material layer 1411 has high carrier mobility, which can improve the carrier transport performance of the hole transport layer 14, and the organic hole transport material layer 1421 forms a directional hole channel to make the transport of the holes more controllable, thereby avoiding the accumulation of excessive holes at the interface between the hole transport layer 14 and the quantum dot light emitting layer 13. Therefore, the carrier transport performance of the QLED device can be improved adopting the method, and the efficiency and durability of the QLED device can be ensured at the same time.

The general molecular formula of the perovskite material is ABX$_3$. In at least one embodiment of the present disclosure, the A can comprise a monovalent alkali metal, a small molecule organic ammonium (for example, Methyl ammonium), or Tl, and the B can comprise Pb or Sn, and the X can comprise Cl or Br. For example, in at least one embodiment, the co-evaporated perovskite precursor can be MACl (methyl ammonium chloride) and PbCl$_2$ (lead chloride), and the formed perovskite material is MAPbCl$_3$ (methylamine lead chloride).

The co-evaporated organic hole transport material can be any electron-rich aromatic hole material. For example, in at least one embodiment, the organic hole transport material can comprise at least one selected from a group consisting of 4,4'-bis(9-carbazole)biphenyl (CBP), tris (4-carbazol-9-ylphenyl) amine (TCTA), poly (9,9-dioctylfluorene-CO-N-(4-butylphenyl) diphenylamine) (TFB), N,N'-bis(3-methylphenyl)-N,N'-diphenyl-1,1'-biphenyl-4,4'-diamine (TPD), N,N'-diphenyl-N,N'-(1-naphthyl)-1,1'-biphenyl-4,4'-diamine (NPB), 4,4'-cyclohexyl bis[N,N-bis(4-methylphenyl) aniline] (TAPC).

As shown in FIG. 2-FIG. 4, the QLED device can further comprise a first electrode 11, an electron transport layer 12, a hole injection layer 15, a second electrode 16, and so on, and these components can be prepared by selecting appropriate materials and using appropriate processes, which are not limited in the present disclosure.

For example, the QLED device can further comprise a base substrate on which the first electrode 11, the electron transport layer 12, the quantum dot light emitting layer 13, the hole transport layer 14, the hole injection layer 15, and the second electrode 16 are sequentially prepared. For example, the base substrate is an array substrate, and pixel circuits for respective sub-pixels of the pixel array have been prepared on the array substrate, and the prepared QLED device is electrically connected to the pixel circuit of the corresponding sub-pixel.

In summary, at least one embodiment of the present disclosure adopts a co-evaporation process to prepare a perovskite material doped with an organic hole transport material as the hole transport layer. On one hand, the high carrier mobility of the perovskite can improve the carrier transport performance of the hole transport layer, thereby eliminating the problem of the carrier transporting imbalance caused by the pure organic hole transport layer. On the other hand, the organic substance self-assembles in the perovskite to form a periodic layered structure to provide a directional hole channel, thus making the transport of the holes more controllable and avoiding the excessive holes from accumulating at the interface between the hole transport layer and the quantum dot light emitting layer. In addition, the evaporation method avoids the perovskite from being easily damaged by the subsequent solution preparation layer in the solution method and can precisely control the doping ratio of the organic hole transport material.

Two specific examples of the embodiments of manufacturing a QLED device using the method of the present disclosure are given below.

In one example, manufacturing a QLED device can comprise the following steps.

Manufacturing a cathode layer: manufacturing an ITO or other metal/semiconductor conductive cathode on the base substrate. For example, the cathode prepared on the base substrate can be cleaned.

Manufacturing an electron transport layer: depositing ZnO nanoparticles on the cleaned ITO or other metal/semiconductor conductive cathode by the solution film forming method (spin coating/printing), and removing the solvent to form a uniform film.

Manufacturing a quantum dot light emitting layer: depositing quantum dots on the electron transport layer by the solution film forming method (spin coating/printing) and removing the solvent to form a uniform film.

Manufacturing a hole transport layer with the perovskite material as the main body: placing the substrate with the electron transport layer and the quantum dot light emitting layer in a vacuum chamber, and the evaporation source being MACl, PbCl$_2$, and CBP. In a case where the vacuum degree reaches 5×10$^{-4}$ Pa, MACl and PbCl$_2$ are co-evaporated, and the molar ratio of MACl and PbCl$_2$ is kept at 1:1.

While the perovskite is co-evaporated, the organic hole transport material CBP is doped into the perovskite, the molar ratio of doping is 0%-10%. Then, the base substrate during the manufacturing process is taken out into an inert gas environment, and baked at about 100° C. for 10 min-30 min to fully react to form the perovskite, and then placed in the vacuum chamber again.

Manufacturing a hole injection layer and an anode: in a case where the thickness of the perovskite hole transport layer reaches the target thickness, evaporating the 2,3,6,7, 10,11-hexacyano-1,4,5,8,9,12-hexaazatriphenylene (HTA-CN) as the hole injection layer, and evaporating the metal Ag as the anode, thereby obtaining the QLED device.

In another example, manufacturing a QLED device can comprise the following steps.

Manufacturing a cathode layer: manufacturing an ITO or other metal/semiconductor conductive cathode on the base substrate. For example, the cathode prepared on the base substrate can be cleaned.

Manufacturing an electron transport layer: depositing TiO$_2$ nanorods on the cleaned ITO or other metal/semiconductor conductive cathode by the solution film forming method (spin coating/printing), and removing the solvent to form a uniform film.

Manufacturing a quantum dot light emitting layer: depositing quantum dots on the electron transport layer by the solution film forming method (spin coating/printing), and removing the solvent to form a uniform film.

Manufacturing a hole transport layer with the perovskite material as the main body: placing the substrate with the electron transport layer and the quantum dot light emitting layer in a vacuum chamber, and the evaporation source being MACl, PbCl$_2$, and CBP. In a case where the vacuum degree reaches 5×10$^{-4}$ Pa, MACl and PbCl$_2$ are co-evaporated, and the molar ratio of MACl and PbCl$_2$ is kept at 1:1. While the perovskite is co-evaporation, the CBP is gradiently doped. The molar ratio of CBP in the hole transport layer on a side close to the quantum dot light emitting layer is lower, about 1%, and the molar ratio of CBP in the hole transport layer on a side away from the quantum dot light emitting layer is higher, about 10%. Then, the base substrate during the manufacturing process is taken out into an inert gas environment, and baked at about 100° C. for 10 min-30 min to fully react to form the perovskite, and then placed in the vacuum chamber again.

Manufacturing a hole injection layer and an anode: in a case where the thickness of the perovskite hole transport layer reaches the target thickness, evaporating the 2,3,6,7, 10,11-hexacyano-1,4,5,8,9,12-hexaazatriphenylene (HTA-CN) as the hole injection layer, and evaporating the metal Ag as the anode, thereby obtaining the QLED device.

In addition, the researcher has fabricated a single-hole device using the hole transport layer (HTL) formed by hybridizing the perovskite material and the organic hole transport material in at least one embodiment of the present disclosure. As a comparison, the researcher also has fabricated a single-hole device using TFB as the hole transport layer. The structures of these two devices both are:

ITO/PEDOT:PSS(40 nm)/HTL(50 nm)/QD(15 nm)/Au (100 nm).

Except that the material of the hole transport layers are different, the structures of the two devices are the same, so they can be compared.

Figure 8:
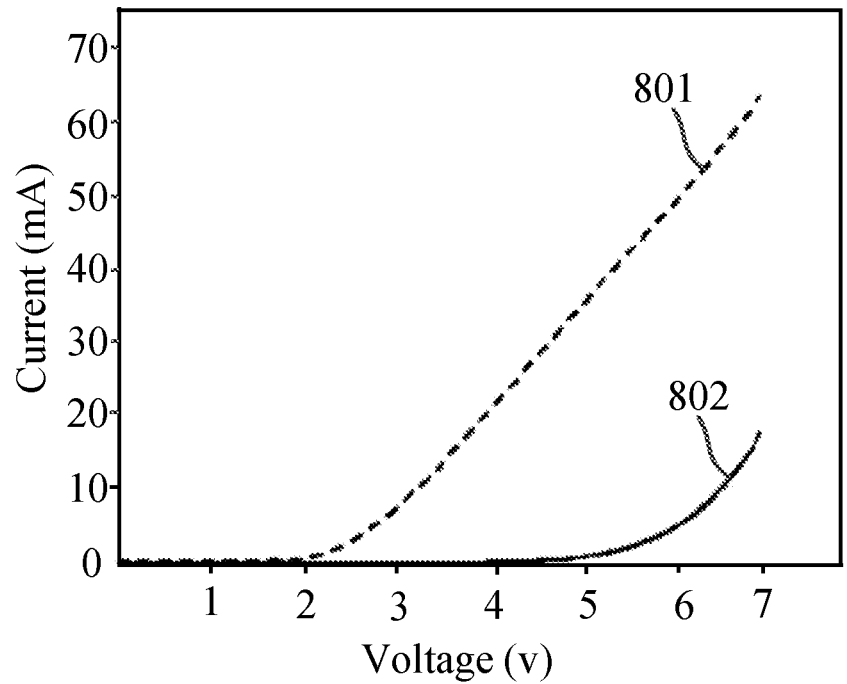
FIG. 8 is a current-voltage curve of a device according to embodiments of the present disclosure.

FIG. 8 shows the current-voltage curves of the above two devices. The curve 801 is the current-voltage curve of a device using the hybrid perovskite of the embodiment of the present disclosure as the hole transport layer, and the curve 802 is the current-voltage curve of a device using the TFB as the hole transport layer.

As shown in FIG. 8, in the voltage range of 2v-7v, the current of the device using the hybrid perovskite of the embodiment of the present disclosure as the hole transport layer is significantly higher than the current of the device using TFB as the hole transport layer. In a case where the voltage is 7v, the current of the device using the hybrid perovskite of the embodiment of the present disclosure as the hole transport layer can reach about 64 mA that is more than 3 times larger than the current of the device using TFB as the hole transport layer. This shows that the hybrid perovskite hole transport layer indeed has higher hole transport performance.

(1) The drawings of the embodiments of the present disclosure involve only the structures in connection with the embodiments of the present disclosure, and other structures can refer to the usual design.

(2) For the purpose of clarity only, in the drawings used to describe the embodiments of the present disclosure, the thicknesses of layers or regions are enlarged or reduced, that is, these drawings are not drawn in a real scale.

(3) In a case of no conflict, the embodiments of the present disclosure and the features in the embodiments can be combined with each other to obtain new embodiments. The above descriptions are only exemplary embodiments of the present disclosure, and are not used to limit the scope of protection of the present disclosure. The scope of protection of the present disclosure is determined by the appended claims.

What is claimed is:

1. A light emitting diode device, comprising:
   a light emitting layer; and
   a hole transport layer on a side of the light emitting layer, wherein the hole transport layer comprises a perovskite material and an organic hole transport material;
   wherein a molar ratio of the organic hole transport material in the hole transport layer increases in a gradient in a direction away from the light emitting layer, and an organic substance doping ratio of the hole transport layer on a side close to the light emitting layer is lower than an organic substance doping ratio of the hole transport layer on a side away from the light emitting layer.

2. The light emitting diode device according to claim 1, wherein the molar ratio of the organic hole transport material in the hole transport layer is greater than 0% and less than or equal to 10%.

3. The light emitting diode device according to claim 1, wherein the hole transport layer is formed by co-evaporating a perovskite precursor and the organic hole transport material.

4. The light emitting diode device according to claim 3, wherein the hole transport layer has a stacked structure formed by the perovskite material and the organic hole transport material.

5. The light emitting diode device according to claim 1, wherein a general molecular formula of the perovskite material is ABX$_3$;

wherein the A comprises a monovalent alkali metal, a small molecule organic ammonium, or Tl; the B comprises Pb or Sn; and the X comprises Cl or Br.

6. The light emitting diode device according to claim 1, wherein the perovskite material comprises $MAPbCl_3$, MA in the $MAPbCl_3$ represents methylamine.

7. The light emitting diode device according to claim 1, wherein the organic hole transport material comprises at least one selected from a group consisting of CBP, TCTA, TFB, TPD, NPB, and TAPC.

8. The light emitting diode device according to claim 1, further comprising a first electrode, an electron transport layer, a hole injection layer, and a second electrode,
wherein the first electrode, the electron transport layer, the light emitting layer, the hole transport layer, the hole injection layer, and the second electrode are sequentially stacked.

9. The light emitting diode device according to claim 8, wherein the electron transport layer is a ZnO nanoparticle layer or a $TiO_2$ nanorod layer.

10. The light emitting diode device according to claim 1, wherein the light emitting layer is a quantum dot light emitting layer or an organic light emitting layer.

11. A display panel, comprising:
a base substrate; and
a plurality of light emitting diode devices arranged in an array on a surface of the base substrate;
wherein each of the plurality of light emitting diode devices comprises: a light emitting layer; and a hole transport layer on a side of the light emitting layer,
the hole transport layer comprises a perovskite material and an organic hole transport materials;
wherein a molar ratio of the organic hole transport material in the hole transport layer increases in a gradient in a direction away from the light emitting layer, and an organic substance doping ratio of the hole transport layer on a side close to the light emitting layer is lower than an organic substance doping ratio of the hole transport layer on a side away from the light emitting layer.

12. A display apparatus, comprising the display panel according to claim 11.

13. A manufacturing method of a light emitting diode device, comprising:
forming a light emitting layer; and
forming a hole transport layer on a side of the light emitting layer;
wherein the hole transport layer comprises a perovskite material and an organic hole transport material;
wherein a molar ratio of the organic hole transport material in the hole transport layer increases in a gradient in a direction away from the light emitting layer, and an organic substance doping ratio of the hole transport layer on a side close to the light emitting layer is lower than an organic substance doping ratio of the hole transport layer on a side away from the light emitting layer.

14. The method according to claim 13, wherein the molar ratio of the organic hole transport material in the hole transport layer is greater than 0% and less than or equal to 10%.

15. The method according to claim 13, wherein forming the hole transport layer on the side of the light emitting layer comprises:
co-evaporating a perovskite precursor and the organic hole transport material to form the hole transport layer on the side of the light emitting layer; and
baking the hole transport layer.

16. The method according to claim 15, wherein the perovskite precursor comprises MACl and $PbCl_2$, MA in the MACl represents methyl ammonium; and the perovskite material comprises $MAPbCl_3$, MA in the $MAPbCl_3$ represents methylamine.

17. The method according to claim 13, wherein a general molecular formula of the perovskite material is $ABX_3$;
wherein the A comprises a monovalent alkali metal, a small molecule organic ammonium, or Tl; the B comprises Pb or Sn; and the X comprises Cl or Br.

18. The method according to claim 13, wherein the organic hole transport material comprises at least one selected from a group consisting of CBP, TCTA, TFB, TPD, NPB, and TAPC.

* * * * *